United States Patent [19]

Balistreri et al.

[11] Patent Number: 5,299,159

[45] Date of Patent: Mar. 29, 1994

[54] SERIAL REGISTER STAGE ARRANGED FOR CONNECTION WITH A SINGLE BITLINE

[75] Inventors: Anthony M. Balistreri, Houston; Andre J. Guillemaud, Sugarland, both of Tex.

[73] Assignee: Texas Instruments Incorporated, Dallas, Tex.

[21] Appl. No.: 905,967

[22] Filed: Jun. 29, 1992

[51] Int. Cl.⁵ ............................................. G11C 7/00
[52] U.S. Cl. ........................... 365/189.04; 365/230.05
[58] Field of Search ....................... 365/189.04, 230.05

[56] References Cited

U.S. PATENT DOCUMENTS 4,984,214 1/1991 Hiltebeitel et al. ............ 365/230.05

Primary Examiner—Eugene R. LaRoche
Assistant Examiner—Viet Q. Nguyen
Attorney, Agent, or Firm—Richard B. Havill; Richard L. Donaldson; Leo N. Heiting

[57] ABSTRACT

A dual-port memory includes an array of dynamic storage cells and a serial register having a plurality of static stages. Each stage of the serial register is arranged for receiving a data bit from a selected storage cell of the array. A plurality of bitlines is interposed between the storage cells of the array and the stages of the serial register. At one time only a single selectable bitline is arranged for interconnecting each of the columns of storage cells with each of the stages of the serial register. Each stage of the serial register includes a latch disabling circuit for selectively enabling and disabling coupling from an output of one amplifier to an input of another amplifier. By disabling such coupling, new data easily can be written into the serial register stage. A keeper circuit in each stage of the serial register reduces power consumption.

9 Claims, 5 Drawing Sheets

SERIAL REGISTER STAGE ARRANGED FOR CONNECTION WITH A SINGLE BITLINE

FIELD OF THE INVENTION

This invention relates to a semiconductor memory device and more particularly to a dual-port memory device including a serial register.

BACKGROUND OF THE INVENTION

Dual-port semiconductor memories, or video random access memories (VRAMs), employ some arrangement of serial access memory for storing a row or a part of a row of data separate from the matrix of storage cells, which forms the main memory array. Stages of the serial access memory, or the serial register, may be either static or dynamic circuits. Static circuits are preferred because they do not lose their contents during any extended inactive period. Typically the static circuit is a latch circuit.

For a serial readout operation, data is transferred from a row of the memory array by way of the bitlines to the serial register stages. This read transfer operation is accomplished by opening transfer gates between pairs of complementary bitlines of the memory array and the complementary storage nodes of the serial register stages, or latches. The states of the serial register stages are statically held and must be switched by the signals applied from the bitlines through the transfer gates. Sometimes it is difficult to switch the states of the serial register stages because the bitline signals are weak and the complementary states of those signals may not be fully separated by the time the transfer to the serial register stages is to take place.

To facilitate the switching of the stages of the serial register, some special designs have been utilized. One such special design uses a virtual power supply for the stages of the serial register. The virtual power supply is switched off when the stages of the serial register are to be loaded with new data. By temporarily switching off the power, the latching signals are diminished so that new data signals on the pairs of complementary bitlines can readily overwrite the states previously stored in the stages of the serial register. Because of high capacitance related to the virtual power supply nodes and because of auto-biasing within the stages of the serial register, the magnitudes of the bitline signals still may be insufficient to assure error free overwrite by the new data read out of the memory array.

SUMMARY OF THE INVENTION

These and other problems are solved by a dual-port memory including an array of dynamic storage cells; a serial register having a plurality of static stages, each stage being arranged for receiving a data bit from a selected storage cell; and a plurality of bitlines, only a single selectable bitline being arranged for interconnecting one column of storage cells to an associated stage of the serial register.

In one aspect of the invention, a multiplexer is interposed between a plurality of the single-sided bitlines and the associated stage of the serial register for selectively coupling a data bit from a selected one of the bitlines into the associated stage of the serial register.

In another aspect of the invention, each stage of the serial register includes a latch circuit having first and second amplifiers, each with an input node and an output node; a lead connecting the output node of the first amplifier with the input node of the second amplifier; a latch disabling circuit for selectively enabling and disabling coupling between the output node of the second amplifier and the input node of the first amplifier; and a lead for applying a signal from the selected bitline to the input node of the first amplifier.

Another circuit, connected between the output and input nodes of the first amplifier, assures that potential levels on the input node of the first amplifier are either a full supply potential level or at ground potential.

BRIEF DESCRIPTION OF THE DRAWING

A better understanding of invention may be derived from the subsequent detailed description of an exemplary embodiment of the invention when that description is read with reference to the drawing wherein.

DETAILED DESCRIPTION

Figure 1:
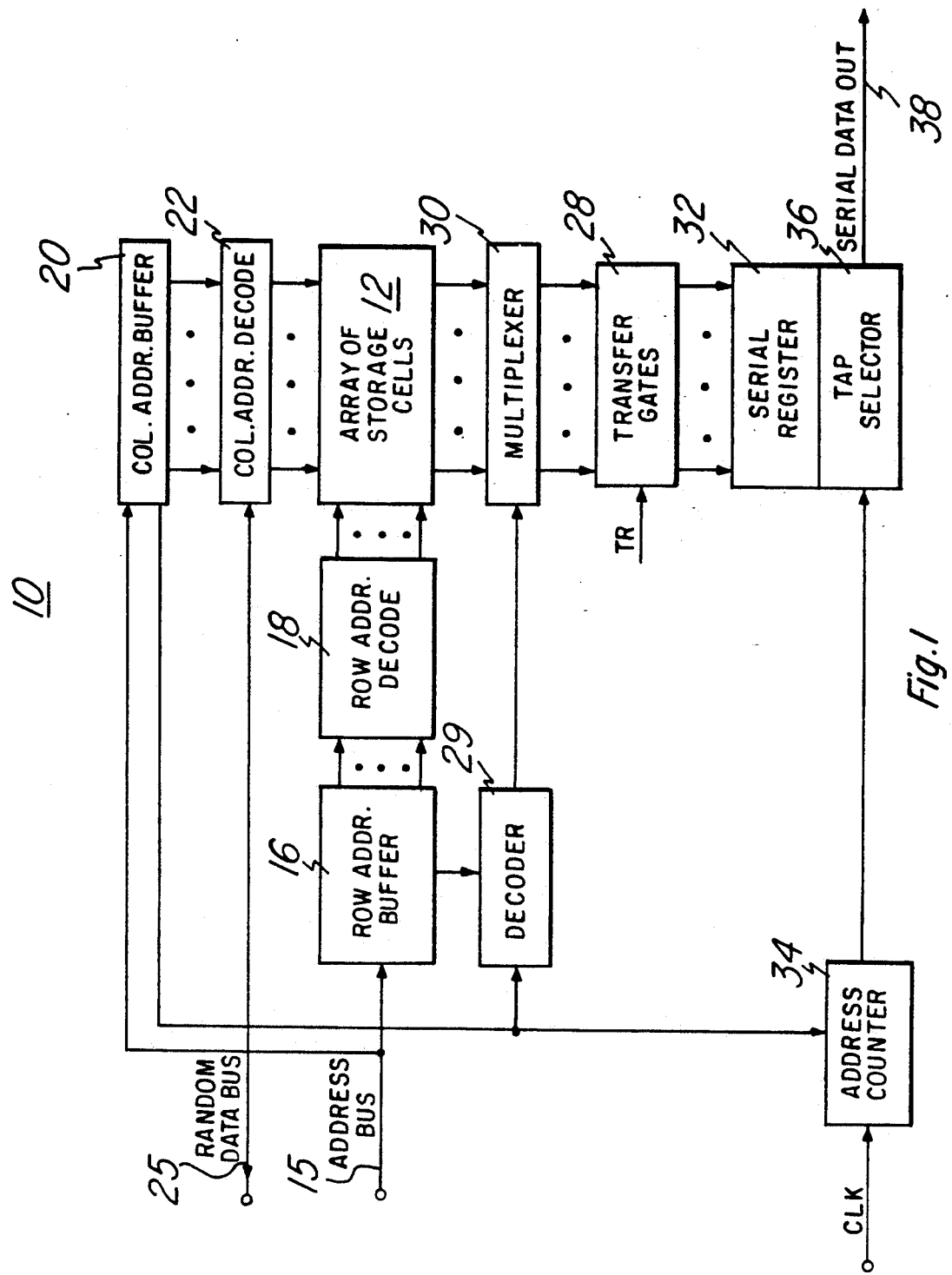
FIG. 1 is a block diagram of a dual-port memory.

Referring now to FIG. 1, there is shown a block diagram of an illustrative dual-port semiconductor memory 10, which also is known as a video random access memory (VRAM). The memory 10 includes an array 12 of MOS dynamic storage cells which are arranged in addressable rows and columns.

For purposes of addressing the storage cells of the array 12 for certain special operations, the array is divided into four separately identifiable sections. Those four sections are identified by left-hand side or right-hand side and low address row or high address row. Therefore the four sections of the array are identified as the high-left section HL, the high-right section HR, the low-left section LL, and the low-right section LR.

For random access operations, a row address is applied by way of an address bus 15 through a row address buffer 16 to a row address decoder 18 for decoding the applied row address into a selection signal for the desired row of the memory array 12. Thereafter, a column address is applied in a time multiplex operation by way of the address bus 15 through a column address buffer 20 and a column address decoder 22 for decoding the applied column address into a selection signal for the desired column. The applied row and column addresses uniquely select a single storage element of the array 12.

If the random access operation is a random write operation, a write signal is activated. Then a new data bit, applied by way of a lead in a data bus 25, is coupled through the column address decoder 22, a pair of complementary bitlines and a sense amplifier to the selected storage cell where it overwrites existing data in the memory array 12. This new data bit remains stored in the selected storage cell until another data bit, in turn, overwrites it. Since the storage cells are dynamic cells, the stored data is volatile and must be refreshed from time-to-time while it is being stored in the array 12.

If the random access operation is a random read operation, the write signal is de-activated. Then the selected data bit residing in the selected storage cell is coupled through the sense amplifier, the complementary pair of bitlines, and the column decoder 22 to the appropriate lead of the data bus 25.

For a read transfer operation, a transfer signal TR is activated and applied to enable a plurality of transfer gates 28. A selected row address is applied by way of the address bus 15 through the row address buffer 16 to the row address decoder 18. That selected row address enables stored data bits to be read out of all storage cells of the selected row of the array 12. The most significant bit of the row address is used for making a part of the selection of a desired section of the array 12. A selected column address is applied by way of the address bus 15 to the column address buffer 20. The most significant bit of the column address is used for the final part of selecting the desired section of the array 12.

The most significant bits of the row and column addresses are decoded by a decoder 29 and are applied to a multiplexer 30. Data bits, from the storage cells along a row of the selected section of the array 12, are coupled through the multiplexer 30 and the transfer gates 28 to the stages of a serial register 32. These data bits are retained in the serial register 32 until they subsequently are written over. The transfer signal TR, applied to the transfer gates, is terminated isolating the data retained in the serial register 32 from data subsequently changed or stored in the storage cells of the array 12.

Once data is retained, or stored, in the stages of the serial register 32, a serial read operation can be commenced. For the serial read operation, a combination of control signals is applied. No row address is required. An initial column address is applied from the address bus 15 through the column address buffer 20 and an address counter 34 to a tap address selection circuit 36. The initial column address presets the address counter 34 to the desired initial tap address. Then clock signals CLK increment the address stored in the address counter 34 every clock cycle. The resulting addresses of a sequence of addresses are decoded by the tap address selection circuit 36 to enable a serial sequence of data bits to be read out of taps of the addressed stages of the serial register 32. The serial sequence of data bits is transmitted through a serial data output terminal 38.

Figure 2:
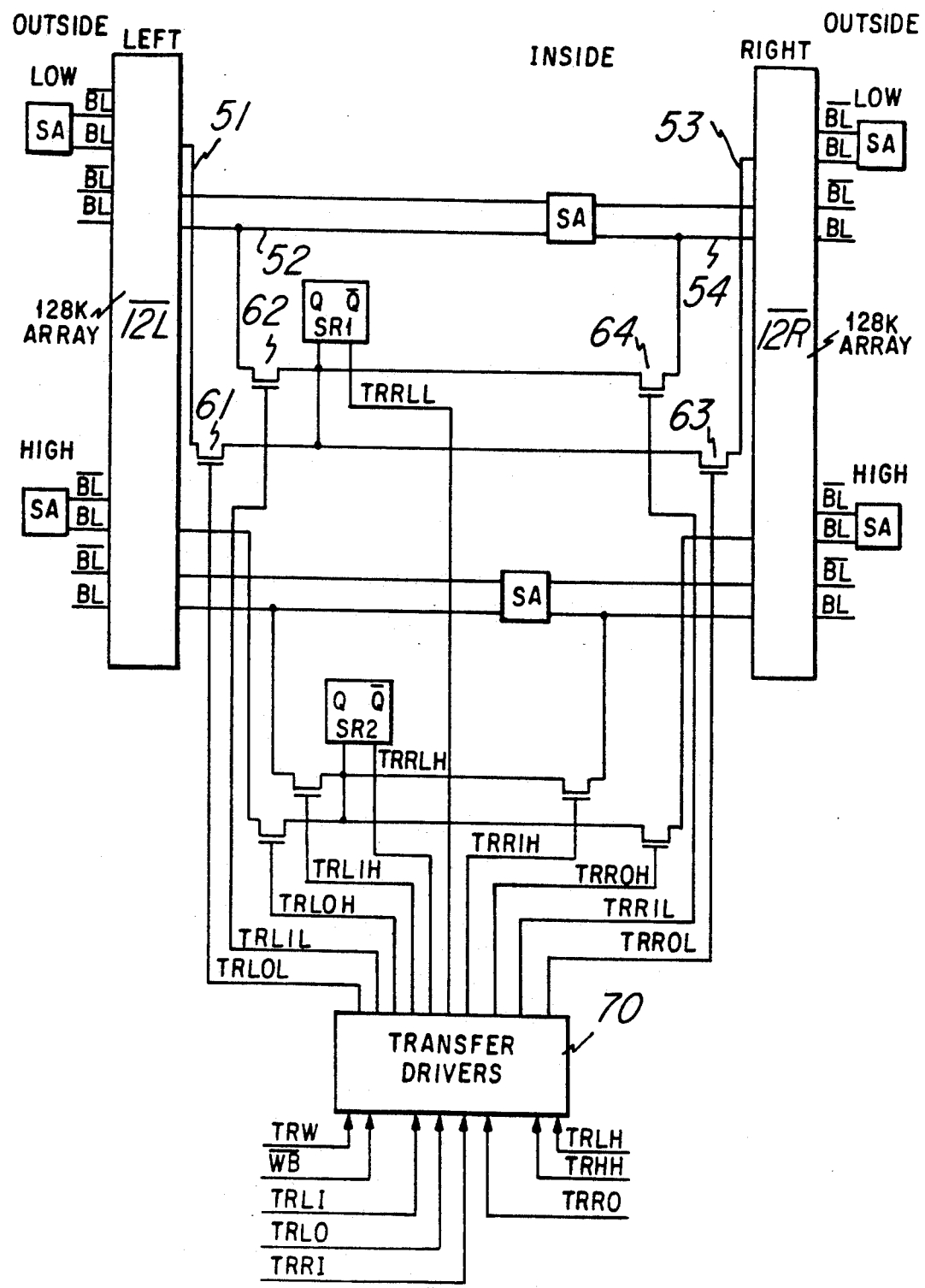
FIG. 2 is a logical block diagram of a portion of the dual-port memory.

Referring now to FIG. 2, there is shown a logic diagram showing a general layout of some of the circuit blocks of the memory 10 of FIG. 1. FIG. 2 is drawn to show how various circuits are associated with one another and how those circuits are enabled for operation.

Array 12 of storage cells is split into halves, i.e., a left half 12L and a right half 12R. There are 128K dynamic storage cells located in each half of the array. None of those storage cells is specifically shown in FIG. 2. Complementary pairs of bitlines BL, $\overline{BL}$ connect columns of the dynamic storage cells with sense amplifiers SA. Each pair of bitlines, shown in FIG. 2, is a half of a column length and connects with a single sense amplifier SA. The sense amplifiers SA are positioned: (1) in between the two halves of the array 12 where they are identified as "inside" sense amplifiers at the top of the drawing and (2) outside of the two halves of the array 12 where they are identified as "outside" sense amplifiers at the top of the drawing.

Two serial register stages SR1 and SR2, representing the plurality of stages of the serial register 32 of FIG. 1, are shown in FIG. 2. In a preferred arrangement, there are a number of serial register stages equal to one-half of the number of columns in the memory array 12. All of the serial register stages are static circuits, or latches. Each of the serial register stages SR1 and SR2 is arranged to be selectively connected with bitlines from both the left and right halves 12L and 12R of the memory array. Special circuit arrangements are included in the device for reading data out of the memory cells and for transferring that data to the appropriate serial register stages.

A single-side of each of two bitline pairs from each half of the memory array are connected selectively through transfer gates to each stage of the serial register. For example the true sides of the bitlines 51, 52, 53, 54 connect, respectively, through transfer gates 61, 62, 63, 64 to the serial register stage SR1. At any time only one of the four transfer gates 61, 62, 63, 64 is enabled to transfer a signal from its associated bitline to the serial register stage SR1. A 1-out-of-4 transfer selection code word, generated by the transfer drivers 70 on leads TRLOL, TRLIL, TRROL, and TRRIL, selects which one of the transfer gates 61, 62, 63, or 64 is enabled for any transfer operation.

In addition to the transfer selection code word, just described, there is a serial register stage unlatching signal TRRLL that is applied to the serial register stage, e.g., SR1, when a data bit read from the memory array is to be transferred into the serial register. This unlatching signal TRRLL also is generated by the transfer drivers 70 and is applied directly to the serial register stage SR1, as described in greater detail subsequently with respect to FIG. 3. Similar other unlatching signals, e.g., TRRLH, are applied to other serial register stages whenever data is to be written into them.

Figure 3:
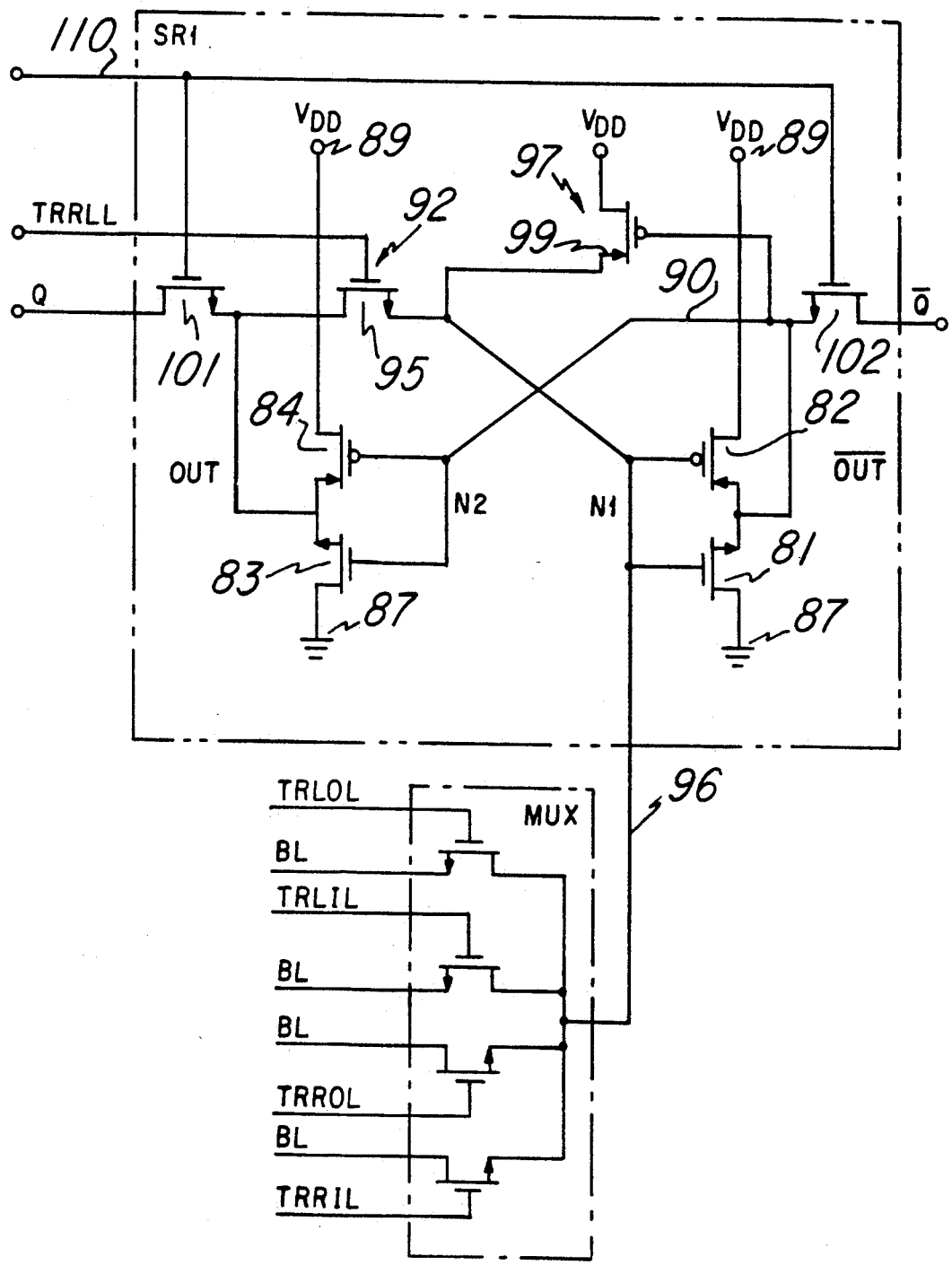
FIG. 3 is a schematic diagram of a serial register stage, or latch.

Referring now to FIG. 3, there is shown a schematic diagram of the serial register stage SR1 and a multiplexer MUX, which is arranged for selectively applying a data bit from a selectable one-of-four bitlines of the memory array of FIG. 2 to one of the complementary logic nodes, N1, of the serial register stage SR1. Serial register stage SR1 is a static circuit, or latch, which includes two cross-coupled MOS transistor amplifier circuits.

A first one of the amplifier circuits includes MOS transistors 81 and 82 having their channels connected in a series circuit between ground potential 87 and supply potential 89. The input node N1 of the serial register stage SR1 connects with the gate electrodes of both of the transistors 81 and 82. Also a first output node $\overline{OUT}$ of the serial register stage SR1 is taken from the connection between the drain electrodes of the transistors 81 and 82.

A second amplifier circuit includes MOS transistors 83 and 84 which have their channels connected in a series circuit between the ground potential 87 and the supply potential 89. A second input node N2 of the serial register stage SR1 is connected to the gate electrodes of the transistors 83 and 84. A second, or true, output node OUT is connected to the drain electrodes of the transistors 83 and 84.

The two amplifier circuits are cross-coupled to form the latch circuit. A lead 90 connects the first output node $\overline{OUT}$ to the second input node N2. A latch disabling circuit 92, including a latching gate 95, is interposed between the second output node OUT and the first input node N1 to provide a controllable connection between the second output node OUT and the first input node N1. The transfer register latch low address control signal TRRLL is applied most of the time to enable the latching gate 95 to conduct from the second output node OUT to the first input node N1. When a data bit is read out of array 12 of FIG. 1 for transfer to the serial register SR1 of FIG. 3, the state of the transfer register latch low addresses signal TRRLL is changed so that it disables conduction through the latching gate 95.

Such disabling of the latching gate 95 within the serial register stage SR1 allows a data bit from a selected bitline, even a low magnitude data bit, to be applied from the multiplexer MUX over a lead 96 to the first input node N1. With the latching being disabled, the state of the first input node N1 can be changed very rapidly and with great certainty even for a low magnitude data bit.

As shown in FIG. 3, there are four bitlines BL connected as inputs to the multiplexer MUX. Additionally, there are four control leads TRLOL, TRLIL, TRROL and TRRIL also connected to the multiplexer MUX. A one-out-of-four code word is applied to those four control leads to couple the bitline, associated with the active control lead, to the lead 96 and the first input node N1 of the serial register stage SR1. As an example, it is assumed that the active signal occurs on the control lead TRLIL. The bitline selected for the "transfer" of a data bit is from the "left" half of the memory array, is associated with an "inside" sense amplifier SA, and is in the "low" half of column addresses, hence TRLIL.

Interposing the latching gate 95 within the serial register stage SR1 provides an effective arrangement for efficiently transferring a data bit into the serial register without causing errors. That feature is not achieved without cost in the operation of the serial register stage SR1. The latching gate 95 by itself would cause the potential applied to the first input node N1 to switch between one threshold drop below the supply potential level and ground potential. These potentials would make the first amplifier operate in either one of two conditions. One condition has the MOS transistor 82 partially turned on. The other condition has that transistor fully turned on. As a result, subthreshold leakage occurs in transistor 82 of the first amplifier, and extra power is consumed.

A keeper circuit 97 including an MOS transistor 99 is arranged within the serial register stage SR1 to assure that the potential levels on the first input node N1 either are the full supply potential $V_{DD}$ or are at ground potential. The transistor 99 has its drain electrode connected to the first input node N1, its source electrode connected to the supply potential $V_{DD}$, and its gate electrode connected to the first output node $\overline{OUT}$.

Figure 4:
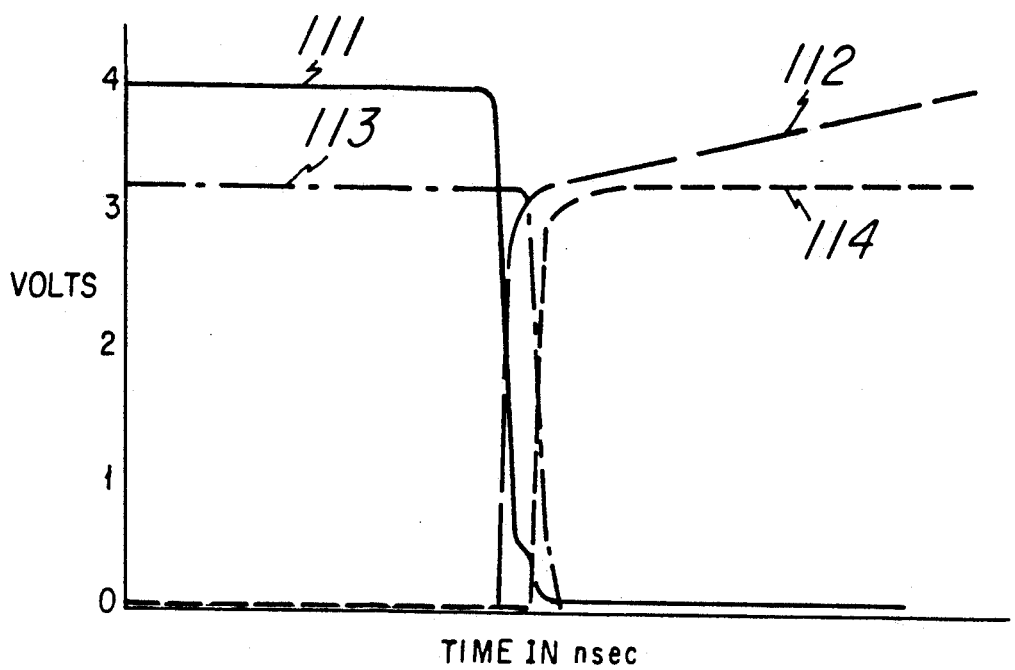
FIG. 4 is a diagram showing operating curves of the serial register stage with and without a keeper circuit.

Referring now to FIG. 4, there are shown operating curves for the serial register stage SR1 both with the keeper, or pullup, circuit 97 and without that keeper circuit.

With the keeper circuit 97 operating, the voltage switching from $V_{DD}$ to ground on the input node N1 is represented by the curve 111 starting at the full supply voltage $V_{DD}$ and falling to ground potential. Similarly the voltage on the input node N1, when switching from ground potential to $V_{DD}$, is represented by the curve 112 which quickly rises to a voltage approximately a threshold voltage below the supply voltage $V_{DD}$. Because the transistor 99 is small, the voltage on the input node N1 thereafter rises slowly to the full supply voltage $V_{DD}$.

If the serial register stage SR1 were operated without the keeper circuit 97, the high to low switching voltage on the input node N1 would follow the curve 113. The high level is a threshold voltage below the supply voltage $V_{DD}$. Curve 114, which represents the low to high switching voltage on the input node N1 also without the keeper circuit 97, rises to and levels off at a level which is a full threshold voltage below the supply voltage $V_{DD}$.

Whether or not the keeper circuit 97 is included in the serial register stage SR1, the voltage on the input node N2 swings from the supply voltage $V_{DD}$ to ground potential or vice versa, as in a conventional latch circuit.

Since the serial register stage SR1 is a latch circuit, the data bit transferred into it is retained therein as long as the supply potential $V_{DD}$ is applied and the transfer register latch low address signal TRRLL enables latching.

A data bit stored in the serial register stage SR1 of FIG. 3 can be read out of the associated tap by enabling output gates 101 and 102 with a control signal on lead 110. A true output signal occurs on an output terminal Q and the complement on an output terminal $\overline{Q}$.

Figure 5:
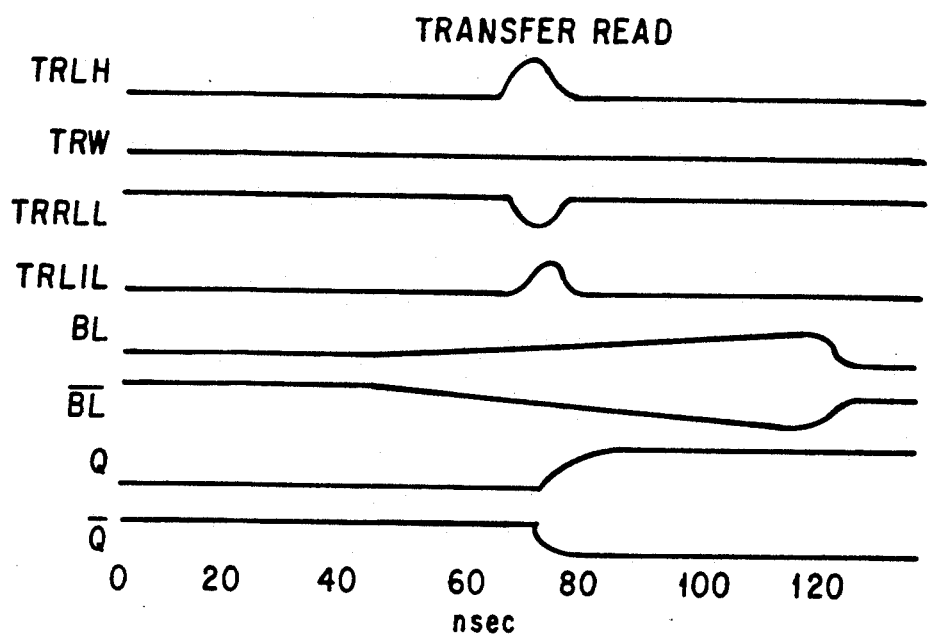
FIG. 5 is a timing diagram of a transfer read operation.

Referring now to FIG. 5, there is shown a timing diagram for a transfer read operation. A control signal transfer left side, high address TRLH is activated. A transfer write signal TRW is a low logic level indicating a read transfer operation is to be done. The transfer register, left, low address signal TRRLL goes inactive and disables the latching gate 95 in the serial register stage SR1. The transfer left, inside, low address signal TRLIL goes active and selects the bitline BL to be connected to the first input node N1 for transferring the desired data bit into the serial register stage SR1. The signal on the true bitline BL increases in magnitude indicating that a "1" is to be transferred from the selected storage cell in the memory array to the serial register stage SR1. Once that data bit is stored in the stage SR1, the true and complement outputs Q and $\overline{Q}$ are set to a state to indicate that a "1" is stored in the stage SR1. A data bit from each storage cell in the selected row of the array can be transferred concurrently into each of the associated serial register stages.

Figure 6:
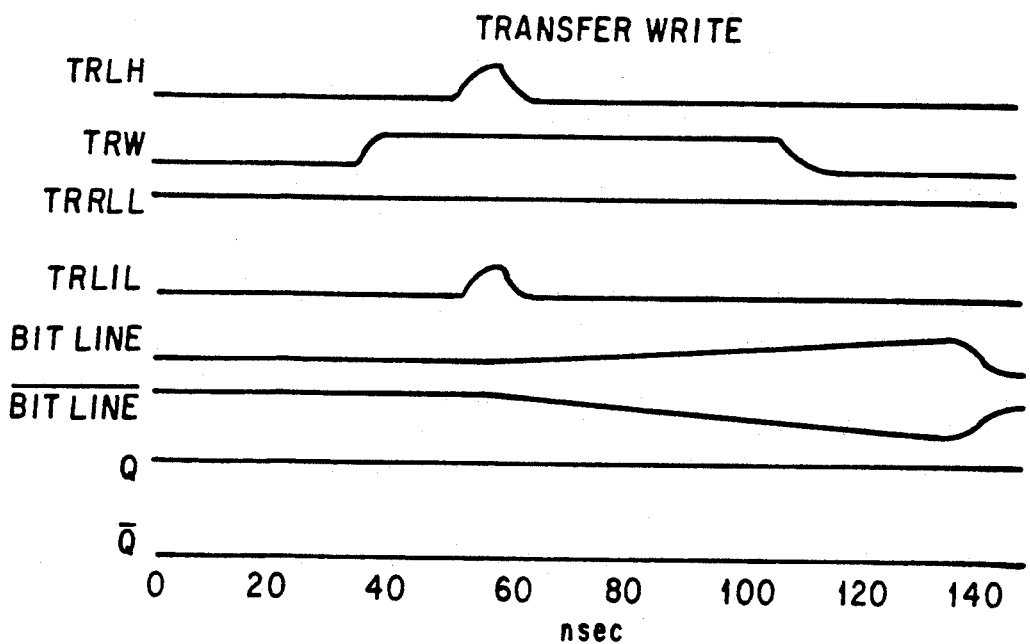
FIG. 6 is a timing diagram of a transfer write operation.

FIG. 6 shows a timing diagram of the same signals for a transfer write operation. In that operation a data bit is transferred from the serial register stage SR1 through the multiplexer MUX, which now functions as a demultiplexer, to apply the stored data bit to a selected one of the four bitlines BL. The selected bitline carries the data bit to the selected storage cell in the memory array where it is stored. A data bit from each of the serial register stages can be transferred concurrently into a selected row of storage cells in the array by this operation.

The foregoing describes the arrangement and operation of an illustrative embodiment of the invention. That embodiment together with other embodiments made obvious in view thereof are considered to fall within the scope of the appended claims.

What is claimed is:

1. A serial register stage comprising:
   a latch circuit having first and second MOS transistor amplifier circuits, each amplifier circuit including an input node and an output node;
   a lead connecting the output node of the first amplifier circuit with the input node of the second amplifier circuit;
   a latch disabling circuit for selectively enabling and disabling coupling between the output node of the second amplifier circuit and the input node of the first amplifier circuit; and a lead for applying an input signal to the input node of the first amplifier circuit.

2. A serial register stage, in accordance with claim 1, wherein the latch disabling circuit includes a latching gate, responsive to a control signal, for enabling or disabling coupling of the output node of the second amplifier circuit to the input node of the first amplifier circuit.

3. A serial register stage, in accordance with claim 2, further comprising:

a circuit, connected between the output and input nodes of the first amplifier circuit, for assuring that potential levels on the input node of the first amplifier circuit are either a full supply potential level or at ground potential.

4. A serial register stage, in accordance with claim 3, further comprising:

a bitline selection circuit having a plurality of inputs, each input connecting with a different single-sided bitline, and having a single output connecting with the input signal lead, and a plurality of control leads, each control lead arranged for applying a selection signal to the bitline selection circuit for enabling a data signal to be coupled from a selected one of the single-sided bitlines to the single output of the bitline selection circuit.

5. A serial register stage, in accordance with claim 2, further comprising:

a bitline selection circuit having a plurality of inputs, each input connecting with a different single-sided bitline, and having a single output connecting with the input signal lead, and a plurality of control leads, each control lead arranged for applying a selection signal to the bitline selection circuit for enabling a data signal to be coupled from a selected one of the single-sided bitlines to the single output of the bitline selection circuit.

6. A serial register stage, in accordance with claim 1, further comprising:

a circuit, connected between the output and input nodes of the first amplifier circuit, for assuring that potential levels on the input node of the first amplifier circuit are either a full supply potential level or at ground potential.

7. A serial register stage, in accordance with claim 1, further comprising:

a bitline selection circuit having a plurality of inputs, each input connecting with a different single-sided bitline, and having a single output connecting with the input signal lead, and a plurality of control leads, each control lead arranged for applying a selection signal to the bitline selection circuit for enabling a data signal to be coupled from a selected one of the single-sided bitlines to the single output of the bitline selection circuit.

8. A serial register stage comprising:

a latch circuit having first and second MOS transistor amplifier circuits, each amplifier circuit including an input node and an output node;

a lead connecting the output node of the first amplifier circuit with the input node of the second amplifier circuit;

a lead for applying an input signal to the input node of the first amplifier circuit; and a circuit, connected between the output and nodes of the first amplifier circuit, for assuring that potential levels on the input node of the first amplifier circuit are either a full supply potential level or at ground potential.

9. A serial register stage comprising:

a latch circuit having first and second MOS transistor amplifier circuits, each amplifier circuit including an input node and an output node;

a lead connecting the output node of the first amplifier circuit with the input node of the second amplifier circuit;

a lead for applying an input signal to the input node of the first amplifier circuit;

a bitline selection circuit having a plurality of inputs, each input connection with a different single-side bitline, and having a single output connecting with the input signal lead; and a plurality of control leads, each control lead arranged for applying a selection signal to the bitline selection circuit for enabling a data signal to be coupled from a selected one of the single-sided bitlines to the single output of the bitline selection circuit.

* * * * *